United States Patent [19]
Minner et al.

[11] 3,946,326
[45] Mar. 23, 1976

[54] TRANSMITTER AMPLIFIER

[75] Inventors: Willy Minner, Schwaiger; Jörn Müller, Aufheim, both of Germany

[73] Assignee: Licentia Patent- Verwaltungs-G.m.b.H., Frankfurt am Main, Germany

[22] Filed: Mar. 30, 1973

[21] Appl. No.: 346,270

[30] Foreign Application Priority Data
Mar. 30, 1972 Germany............................ 2215540

[52] U.S. Cl. .................... 330/26; 330/109; 330/149
[51] Int. Cl.² ........................................... H03F 1/26
[58] Field of Search ......... 330/31, 26, 109, 25, 149, 330/27; 325/105, 123, 159

[56] References Cited
UNITED STATES PATENTS

| | | | |
|---|---|---|---|
| 3,040,264 | 6/1962 | Weidner .............................. | 330/25 |
| 3,204,273 | 9/1965 | Wood .................................. | 330/21 |
| 3,209,273 | 9/1965 | Wood .................................. | 330/31 X |
| 3,222,610 | 12/1965 | Evans et al. ........................ | 330/25 |
| 3,239,770 | 3/1966 | Taber.................................. | 330/31 X |
| 3,241,082 | 3/1966 | Lister et al......................... | 330/26 X |
| 3,417,341 | 12/1968 | Elias .................................. | 330/31 X |
| 3,434,070 | 3/1969 | Bartnik et al....................... | 330/31 |

OTHER PUBLICATIONS

Electronic Engineering, June 1967, pp. 352–355, A 50 to 500 mHz Broadband Transistor Amp. ("Hilling").
International Solid–State Circuit Conference, 1965, pp. 90, 91, Digest of Tech. Papers, Session 9, Hi. Freq. Amps., (A Trans. Amp. With 500 MC Bandwidth) ("Howell").

Primary Examiner—James B. Mullins
Attorney, Agent, or Firm—Spencer & Kaye

[57] ABSTRACT

A transmitter amplifier comprises a transistor forming a class B or C amplifier element and output and input circuits for the amplifier element connected by a low-pass filter with a limiting frequency below the intended frequency band of the amplifier.

8 Claims, 3 Drawing Figures

TRANSMITTER AMPLIFIER

BACKGROUND OF THE INVENTION

The invention relates to a transmitter amplifier in which a transistor is provided as a class B or C amplifier element.

Transmitter amplifiers, which operate in class B or C and are equipped with a transistor, include, at the input and output of the transistor, networks, which serve for the transformation of the signal source resistance at the input of the transistor and for the transformation of the output power at the load resistor or at the antenna. Part of the elements of these networks are additionally used for introducing the operational voltage and adjustment of the operating point. These networks comprise reactive elements, capacitors and inductors, so that the transformation paths are frequency-dependent and give the required transformation only for the desired frequency or for the desired frequency band. Further the requirement that the transmitter amplifiers operate stably even in the case of a mismatch at the input and output and produce no parasitic oscillations, is placed on transmitter amplifiers.

In practice, however, in the case of mismatching of the output, which, for example, is realized by an open or short-circuited line of variable length, the excitation of parasitic frequencies $f_p$ outside the desired frequency band is observed. The parasitic oscillations are of a substantially lower frequency than the desired frequency, their mixing products with the desired frequency $f_N$ however yield frequencies $f_M$ which fall into the desired frequency band, since $$f_M = f_N \pm n f_p$$

wherein integral multiples of the parasitic frequency are designated by $n$ (= 1, 2, 3 and so on).

To suppress these parasitic frequencies in the input and output of the stage, it is known to insert frequency-dependent elements, which represent damping for the low frequencies. The success of these measures is only slight on account of the specified frequency dependency, because, on the one hand the damping cannot be chosen to be any effecting level, without reducing the amplification of the desired frequency, and, on the other hand, the damping is not designed to be broad banded at any event, so that this does not act in like manner for all the frequencies lying far outside the desired frequency band.

SUMMARY OF THE INVENTION

The invention has for its object, in the case of a transmitter amplifier of the type mentioned at the outset, of eliminating the excitation of parasitic oscillations, i.e., care is to be taken that the transmitter amplifier does not excite itself. According to the invention, there is provided a transmitter amplifier comprising a transistor forming a class B or C amplifier element, an output circuit for said transistor, an input circuit for said transistor and a low-pass filter connecting said output circuit and said input circuit and having a limiting frequency below the intended frequency band of the amplifier.

Basically, the invention proposes, in the case of a transmitter amplifier of the type mentioned at the outset, that the output circuit of the transistor is connected to the input circuit of the transistor by means of a low-pass filter, the limiting frequency of which is below the usual frequency or of the usual frequency band of the transmitter amplifier.

By a low-pass filter is understood, as is well known a network with a limiting frequency, up to which all frequencies are transmitted uniformly or almost uniformly. The low-pass filter comprises, for example, an inductor in the longitudinal branch or a series circuit of an inductor with an ohmic resistor in the longitudinal branch. According to another form of embodiment of the invention the low-pass filter comprises two resistors in the longitudinal branch and a capacitor in the transverse branch, which is connected to earth at the junction of the resistors. According to a further development of the invention, further low-pass filter elements are provided in the said low-pass filters, which elements further improve the properties of the low-pass filter with regard to the suppression of parasitic oscillations, according to the network theory.

BRIEF DESCRIPTION OF THE DRAWINGS

The invention will be now described in greater detail by way of example with reference to the drawings, in which.

DESCRIPTION OF THE PREFERRED EMBODIMENT

Figure 1:
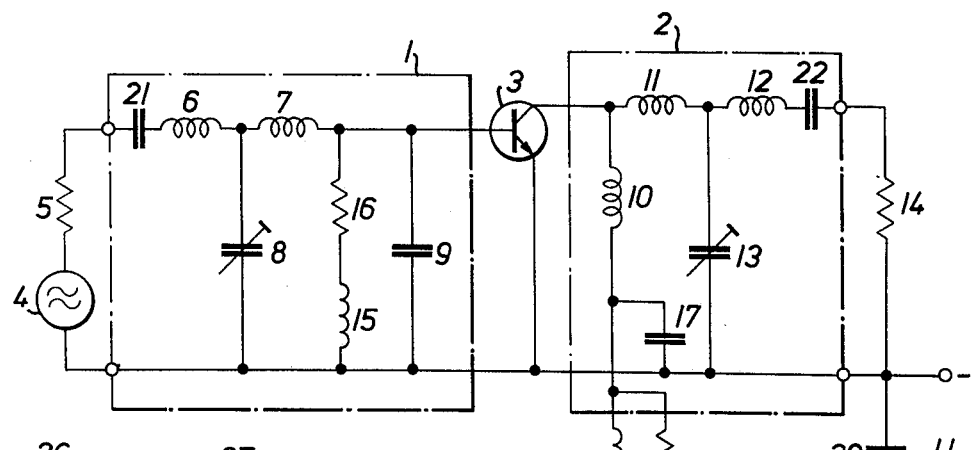
FIG. 1 shows a transmitter amplifier as is known from the prior art.

Referring now to the drawings, a known transmitter amplifier of FIG. 1 comprises substantially an input circuit 1 and an output circuit 2, the amplifier transistor 3 being connected between these two switching circuits. The generator 4 with its generator resistor 5 is connected to the input circuit 1. The transformation network, comprising inductors 6 and 7 and capacitors 8 and 9, conveys the power to the transistor 3. The output circuit 2 is connected to the load resistor 14 by means of the transformation network, comprising the inductors 10, 11 and 12 and the capacitor 13. The choke 15 and the resistor 16 represent the operating point of the transistor in class B or C, the resistor 16 in this case is to suppress the excitation of parasitic oscillations of low frequencies. The capacitor 17 in conjunction with the choke 18 and the resistor 19 has the same task, the value of the capacitative reactance 17 being chosen so high that this represents a short circuit for the desired frequency, but for lower frequencies permits the resistor 19 to be active as damper. However, for very low frequencies the effectiveness of the damping is determined by the choke 18.

The capacitors 21 and 22 serve for the direct current separation, and the capacitor 20 to block off the voltage $U_B$.

Figure 2:
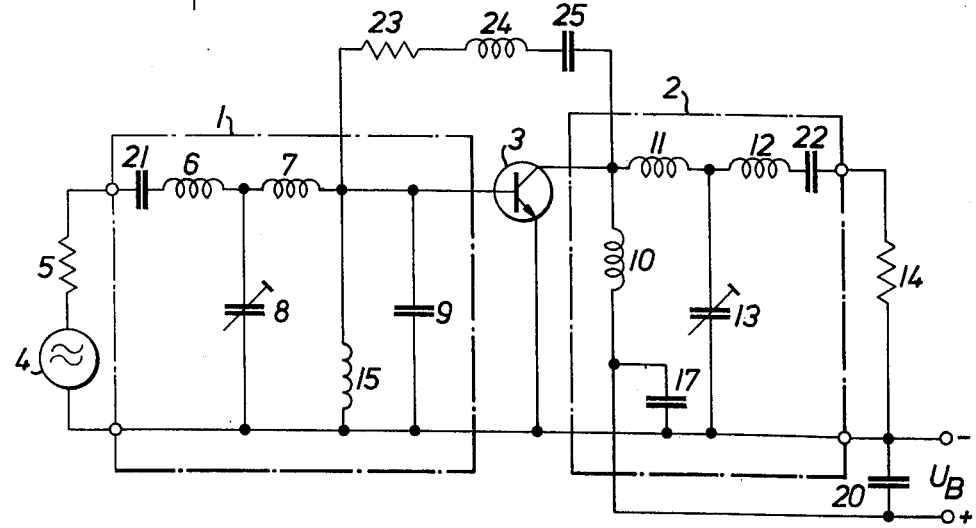
FIG. 2 shows a transmitter amplifier according to the invention having a low-pass filter element to suppress parasitic oscillations.

FIG. 2 shows an example of the circuit arrangement in accordance with the invention, elements of the same function being given the same reference numerals. The transmitter amplifier in accordance with the invention of FIG. 2 differs from the known transmitter amplifier of FIG. 1 substantially in that a simple kind of low-pass filter is arranged between the output circuit 2 and the input circuit 1, comprising the resistor 23 and the inductor 24. The capacitor 25 serves only for the direct current separation. The resistors 16 and 19 as well as the choke 18 of the transmitter amplifier of FIG. 1 are dispensed with, since their task is fulfilled substantially better and without delimitation to the lowest frequencies by the inventive provision of the low-pass filter. If need be, the task in accordance with the invention can be improved by inserting further low-pass filter elements.

Figure 3:
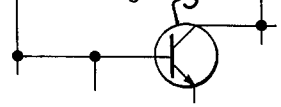
FIG. 3 is a detail view of another embodiment of a low-pass filter element according to the invention.

It will be understood that the above description of the present invention is susceptible to various modification changes and adaptations. As illustrated in FIG. 3, the low-pass filter could alternatively be constituted by a series of arrangement of two resistors 26 and 27 connected between the base and collector of the transistor and a capacitor 28 connected between the junction of resistors 26 and 27 and ground.

What is claimed is:

1. A transmitter amplifier comprising a transistor forming a class B or C amplifier element, an output circuit for said transistor, an input circuit for said transistor and a low-pass filter connecting said output circuit and said input circuit and having a limiting frequency below the intended frequency band of the amplifier.

2. An amplifier as defined in claim 1, wherein said low-pass filter comprises an inductance in the direct path between said output and input circuits.

3. An amplifier as defined in claim 1, wherein said low-pass filter comprises an inductance and a resistance connected in series in the direct path between said input and output circuits.

4. An amplifier as defined in claim 1, wherein said low-pass filter comprises two resistances in the direct path between said input and output circuits and a capacitance connected between earth and a junction between said two resistances.

5. An amplifier as defined in claim 1, further comprising a capacitor connected in series with said low-pass filter to block flow of direct current through said filter.

6. An amplifier as defined in claim 1 wherein said low-pass filter is connected between the point of connection of said input circuit to said transistor and the point of connection of said output circuit to said transistor.

7. An amplifier as defined in claim 6 comprising means connected to bias said transistor for class B or C operation.

8. In a transmitter amplifier including a transistor forming a class B or C amplifier element for amplifying signals over a predetermined frequency range, the transistor having an input terminal and an output terminal and the amplifier further including an output circuit connected to the output terminal of the transistor and an input circuit connected to the input terminal of the transistor, the improvement comprising a low-pass filter connected between said output circuit and said input circuit and having a limiting frequency below the predetermined frequency range of the amplifier, said filter serving to prevent the excitation of parasitic oscillations in said amplifier.

* * * * *